United States Patent [19]
Hong

[11] Patent Number: 5,484,744
[45] Date of Patent: Jan. 16, 1996

[54] METHOD FOR FABRICATING A STACKED CAPACITOR FOR DYNAMIC RANDOM ACCESS MEMORY CELL

[75] Inventor: Gary Hong, Hsinchu, Taiwan

[73] Assignee: United Microelectronics Corporation, Hsinchu, Taiwan

[21] Appl. No.: 422,291

[22] Filed: Apr. 14, 1995

[51] Int. Cl.$^6$ .............................. H01L 21/70; H01L 27/00
[52] U.S. Cl. ................................ 437/52; 437/60; 437/919
[58] Field of Search ..................... 437/47, 52, 60, 437/919

[56] References Cited

U.S. PATENT DOCUMENTS

| | | | |
|---|---|---|---|
| 5,223,448 | 6/1993 | Su | 437/47 |
| 5,346,847 | 9/1994 | Jun | 437/60 |
| 5,352,621 | 10/1994 | Kim et al. | 437/52 |

*Primary Examiner*—Olik Chaudhuri
*Assistant Examiner*—H. Jey Tsai
*Attorney, Agent, or Firm*—Townsend and Townsend and Crew

[57] ABSTRACT

The present invention provides a method of fabricating a DRAM cell capacitor having an improved capacitance by increasing the surface area of the electrode plate. First, a first insulating layer, a second insulating layer, and a barrier layer are formed sequentially on a semiconductor substrate having source/drain regions. Next, a portion of the barrier layer is etched to form a first contact opening over one of the source/drain regions. A first sidewall spacer is formed on the sidewall of the first contact opening of the barrier layer. Similarly, a second contact opening is formed by etching the second insulating layer using the barrier layer and the first sidewall spacer as a mask, and a second sidewall spacer is formed on the sidewall of the second contact opening of the second insulating layer. Then, a third contact opening is formed by etching the first insulating layer using the first sidewall spacer, the second sidewall spacer, and the second insulating layer as a mask, meanwhile the barrier layer is also removed. After removing the second sidewall spacer, a first electrode plate is formed overlying the exposed surfaces of the first sidewall spacer, the second insulating layer, the first insulating layer, and the semiconductor substrate. Hence, the first electrode plate is connected to one of the source/drain regions through the third contact opening. Finally, a dielectric layer is formed on the first electrode plate, and a second electrode plate is formed on the dielectric layer to complete the capacitor fabrication.

9 Claims, 6 Drawing Sheets

5,484,744

METHOD FOR FABRICATING A STACKED CAPACITOR FOR DYNAMIC RANDOM ACCESS MEMORY CELL

BACKGROUND OF THE INVENTION

1. Field of the Invention

This invention relates to the fabrication of integrated circuit (IC) devices, and more particularly to a method of fabricating a dynamic random access memory (DRAM) cell capacitor having an improved capacitance by increasing the surface area o,f the electrode plate.

2. Description of the Prior Art

Dynamic random access memory (DRAM), which comprises an array of memory cells, is a widely utilized integrated circuit (IC) device. Each memory cell in the array comprises, as shown in FIG. 1, a metal-oxide semiconductor field-effect transistor (MOSFET) 10 and a capacitor 12. The gate terminal of the MOSFET 10 is connected to a word line (WL), and the other two terminals (source and drain) of the MOSFET 10 are connected to the capacitor 12 and a bit line (BL), respectively. When reading the contents of the memory cell, the gate terminal receives a pulse on the word line WL to turn-on the MOSFET 10. The capacitor 12 is then discharged and the bit of data stored therein is sent out the bit line (BL). On the other hand, when writing data to the memory cell, data is provided on the bit line and the gate terminal receives a pulse through the word line to turn-on the MOSFET 10. The capacitor 12 is then charged to store the data on the bit line. As is well known to persons skilled in this art, a capacitor is utilized for storing the data content of each memory cell. The bit in question, either a one or a zero, as stored in the memory cell, is determined by whether the capacitor is charged or not. Due to the inherent nature of the DRAM design, the capacitor should possess high capacitance in order to maintain its data content for as long a period of time as possible.

A stacked capacitor is a commonly used structure in DRAM cells. Referring to FIG. 2, there is shown a silicon substrate 2. Field oxide 20, gate electrode 22, and source/drain areas 30 are formed on the silicon substrate 2 successively. An insulating layer 24, such as a silicon dioxide layer, is deposited over the gate electrode 22 and source/drain areas 30. A first polysilicon layer 34 (bottom electrode plate of the stacked capacitor), a dielectric layer 36, such as nitride/oxide (NO) or oxide/nitride/oxide (ONO) layers, and a second polysilicon layer 38 (top electrode plate of the stacked capacitor) are next formed on the insulating layer 24, respectively, so as to construct a cell capacitor.

With the continuous increase of device density on integrated circuits, the DRAM cell area is getting smaller which results in a smaller capacitor and hence less capacitance. There are two methods to increase the capacitance: (i) decrease the effective dielectric thickness and (ii) increase the capacitor's surface area. However, higher capacitance values cannot be obtained without seriously degrading the device retention time because dielectric films thinner than 50 Å presently have excessive leakage currents due to direct carrier tunneling. On the other hand, for a given capacitor dielectric film, the larger the surface area of the capacitor, the higher the capacitance. Therefore, various kinds of stacked-capacitor structure and surface morphology modification of storage electrode have been developed, in order to obtain a large enough storage capacitance for DRAM circuit operation.

SUMMARY OF THE INVENTION

Accordingly, it is an object of the present invention to provide a method of fabricating a DRAM cell capacitor having large electrode plate surface area, so as to increase the capacitance of a capacitor.

In order to achieve the above object, a novel method of fabricating a DRAM cell capacitor having an improved capacitance by increasing the surface area of the electrode plate is provided. First, a first insulating layer, a second insulating layer, and a barrier layer are formed sequentially on a semiconductor substrate having source/drain regions. Next, a portion of the barrier layer is etched to form a first contact opening over one of the source/drain regions. A first sidewall spacer is formed on the sidewall of the first contact opening of the barrier layer. Similarly, a second contact opening is formed by etching the second insulating layer using the barrier layer and the first sidewall spacer as a mask, and a second sidewall spacer is formed on the sidewall of the second contact opening of the second insulating layer. Then, a third contact opening is formed by etching the first insulating layer using the first sidewall spacer, the second sidewall spacer, and the second insulating layer as a mask, meanwhile the barrier layer is also removed. After removing the second sidewall spacer, a first electrode plate is formed overlying the exposed surfaces of the first sidewall spacer, the second insulating layer, the first insulating layer, and the semiconductor substrate. Hence, the first electrode plate is connected to one of the source/drain regions through the third contact opening. Finally, a dielectric layer is formed on the first electrode plate, and a second electrode plate is formed on the dielectric layer completing the capacitor fabrication.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENTS

A detailed description of a preferred embodiment in accordance with the present invention will now be made referring to the accompanying drawings.

Figure 3A:
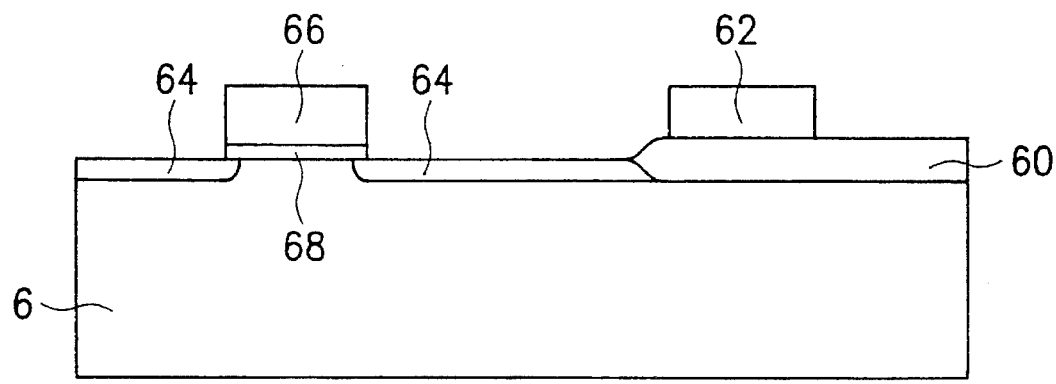
FIGS. 3A to 3I schematically illustrate, in cross-sectional view, the process steps of a preferred embodiment of a stacked capacitor in accordance with the present invention.

First, as can be seen in FIG. 3A, a field oxide layer 60 is formed on a semiconductor substrate 6, such as a silicon substrate, by conventional local oxidation of silicon (LOCOS)process. A transistor including a gate electrode 66, a gate insulator 68, and source/drain regions 64 is formed on the silicon substrate 6. For example, a thin silicon dioxide layer is formed by thermal oxidation or chemical vapor deposition (CVD) to construct the gate insulator 68. A polysilicon layer is deposited and patterned to construct the gate electrode 66. Then the source/drain regions 64 are formed by ion implantation using the gate electrode 66 as a mask.

Figure 3B:
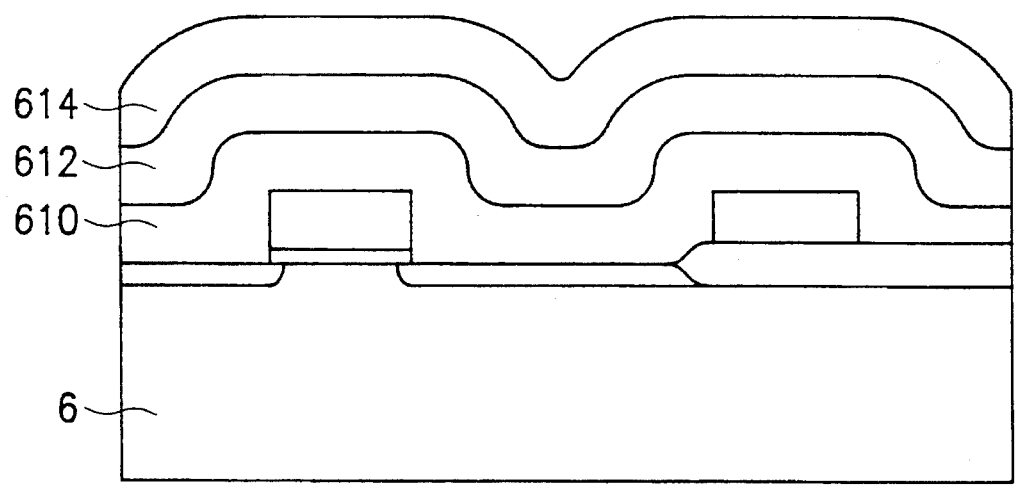

Next, as can be seen in FIG. 3B, a first insulating layer 610, a second insulating layer 612, and a barrier layer 614 are formed sequentially on the semiconductor substrate 6, preferably by CVD. The second insulating layer 612 uses a material other than that of the first insulating layer 610. Similarly, the barrier layer 614 uses a material other than that of the second insulating layer 612. For example, both the first insulating layer 610 and the barrier layer 614 are made of silicon dioxide. The second insulating layer 612 is made of silicon nitride. All of the above layers are deposited to a thickness of between 2000 Å to 4000 Å.

Figure 3C:
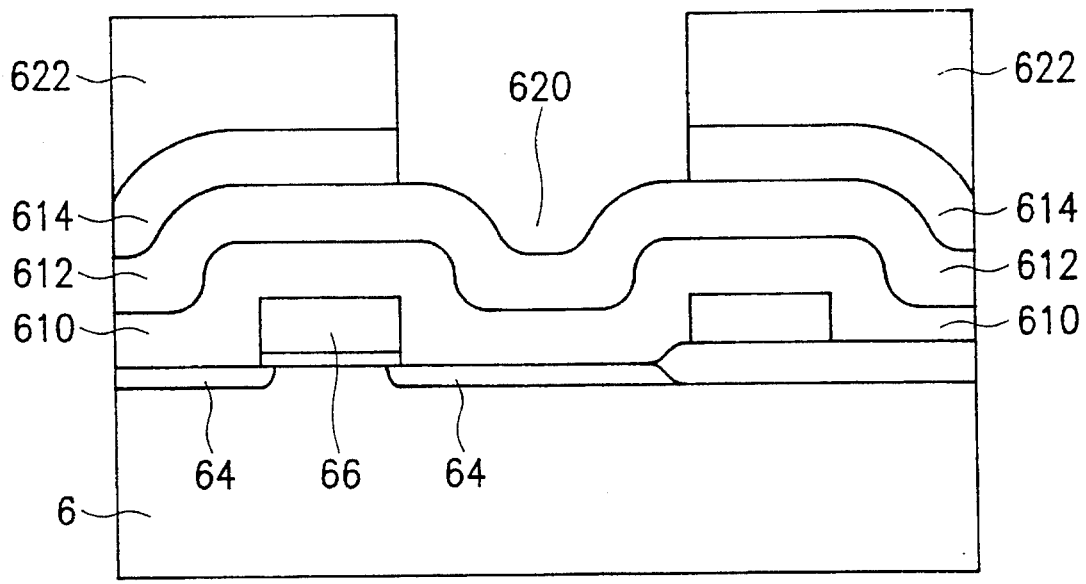

Please now refer to FIG. 3C, a first contact opening 620 over one of the source/drain regions 64 is formed on the barrier layer 614. For example, a photoresist layer 622 is coated on the surface of the barrier layer 614 and patterned by conventional lithography technique. A portion of the barrier layer 614 not covered by the photoresist layer 622 is etched away preferably by reactive ion etching (RIE) to form the first contact opening 620. After that, the photoresist layer 622 is stripped by an appropriate solvent.

Figure 3D:
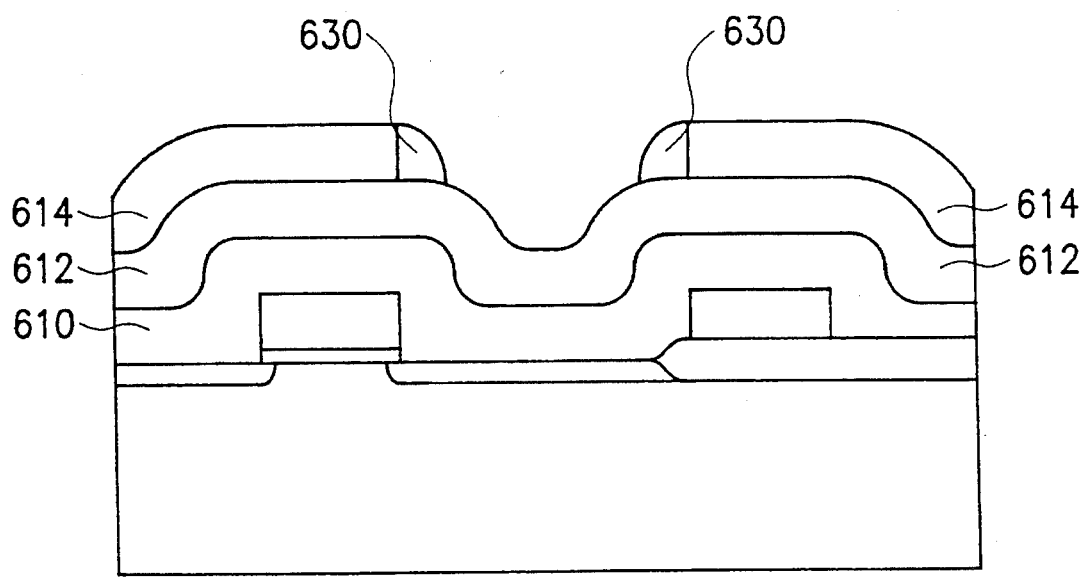

Referring to FIG. 3D, a first sidewall spacer 630 is formed on the sidewall of the first contact opening 620 of the barrier layer 614. For example, a polysilicon layer with a thickness of between 2000 Å to 4000 Å is deposited by CVD first. Then the polysilicon layer is etched back by RIE to leave the polysilicon sidewall spacer 630.

Figure 3E:
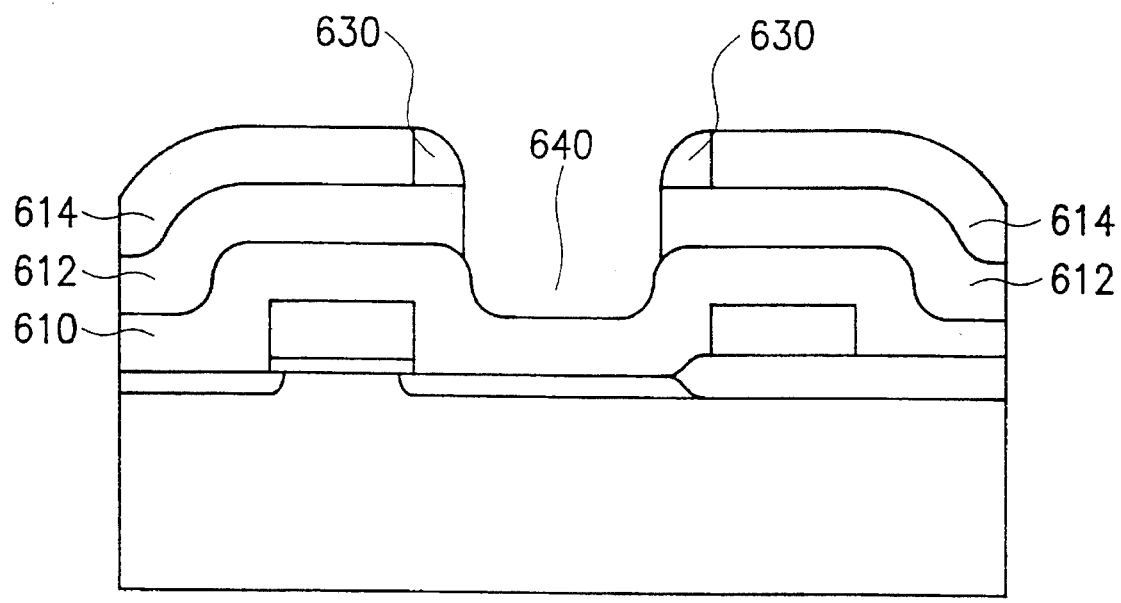
Figure 3F:
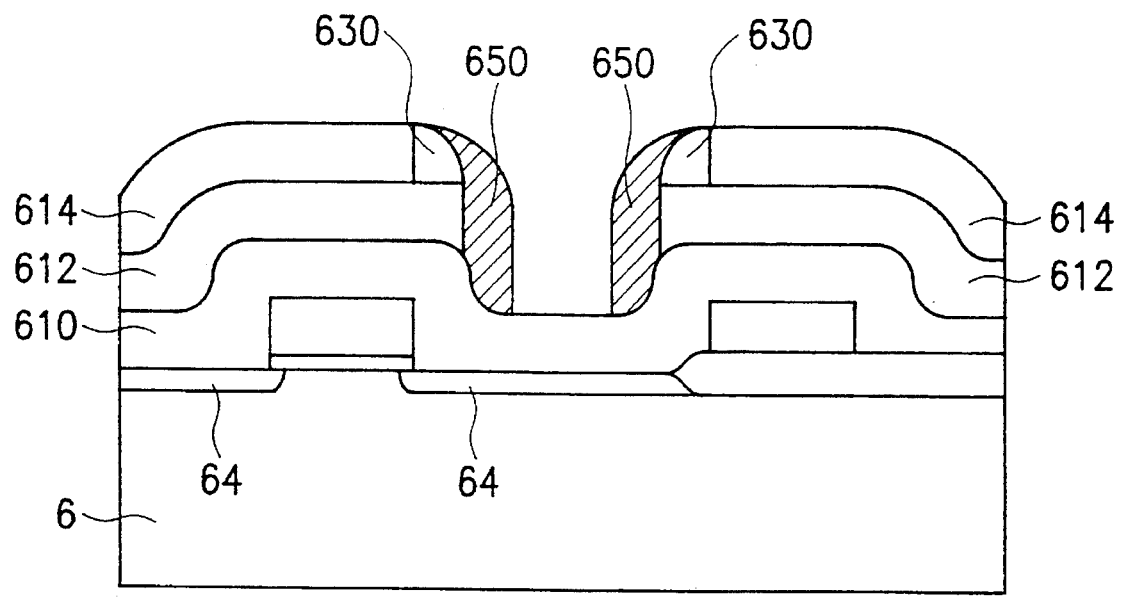

Subsequently, as shown in FIG. 3E, a second contact opening 640 is formed by anisotropic etching the second insulating layer 612 using the barrier layer 614 and the first sidewall spacer 630 as a mask. After that, a second sidewall spacer 650 is formed on the sidewall of the second contact opening 640 of the second insulating layer 612, as can be seen in FIG. 3F. In this embodiment, a photoresist layer is coated and etched back to form the second sidewall spacer 650.

Figure 3G:
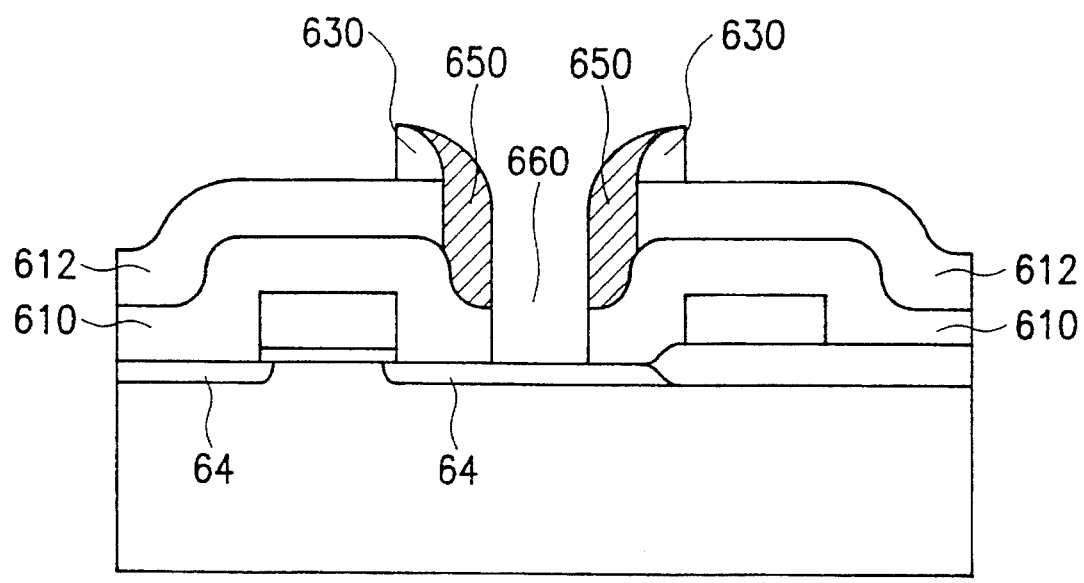
Figure 3H:
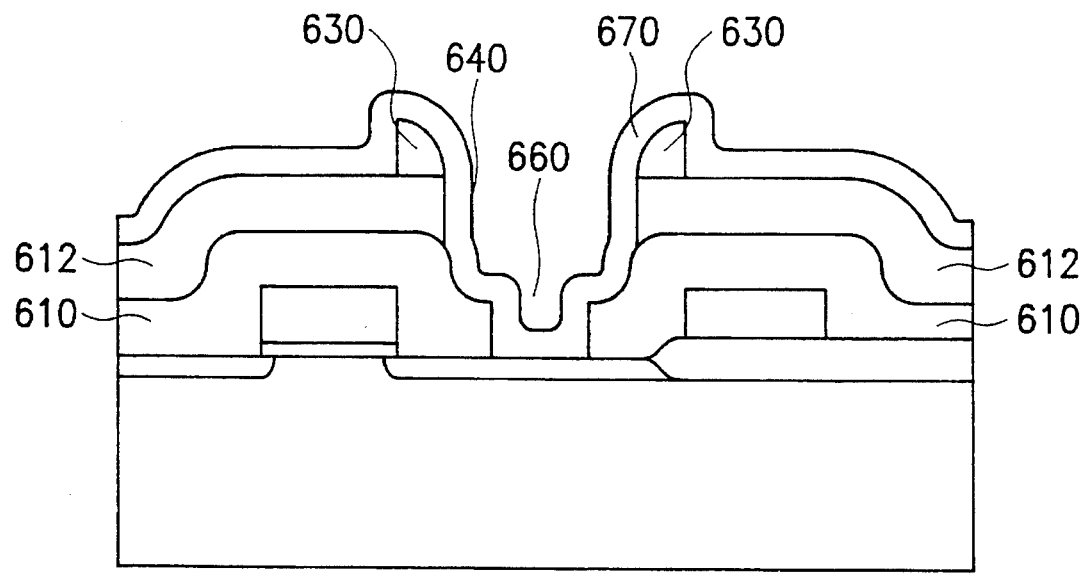

Referring to FIG. 3G, a third contact opening 660 is formed by anisotropic etching of the first insulating layer 610 using the first sidewall spacer 630, the second sidewall spacer 650, and the second insulating layer 612 as a mask. Meanwhile, the barrier layer 614 is also etched away. The third contact opening 660 now exposes one of the source/drain regions 64. After that, the second sidewall spacer (photoresist) 650 is stripped away by an appropriate solvent. A first electrode plate 670, such as a polysilicon layer doped with impurities, is formed preferably by CVD overlying the exposed surfaces of the first sidewall spacer 630, the second insulating layer 612, the first insulating layer 610, and the semiconductor substrate 6, as shown in FIG. 3H. The first electrode plate 670 is connected to one of the source/drain regions 64 through the third contact opening 660.

Figure 3I:
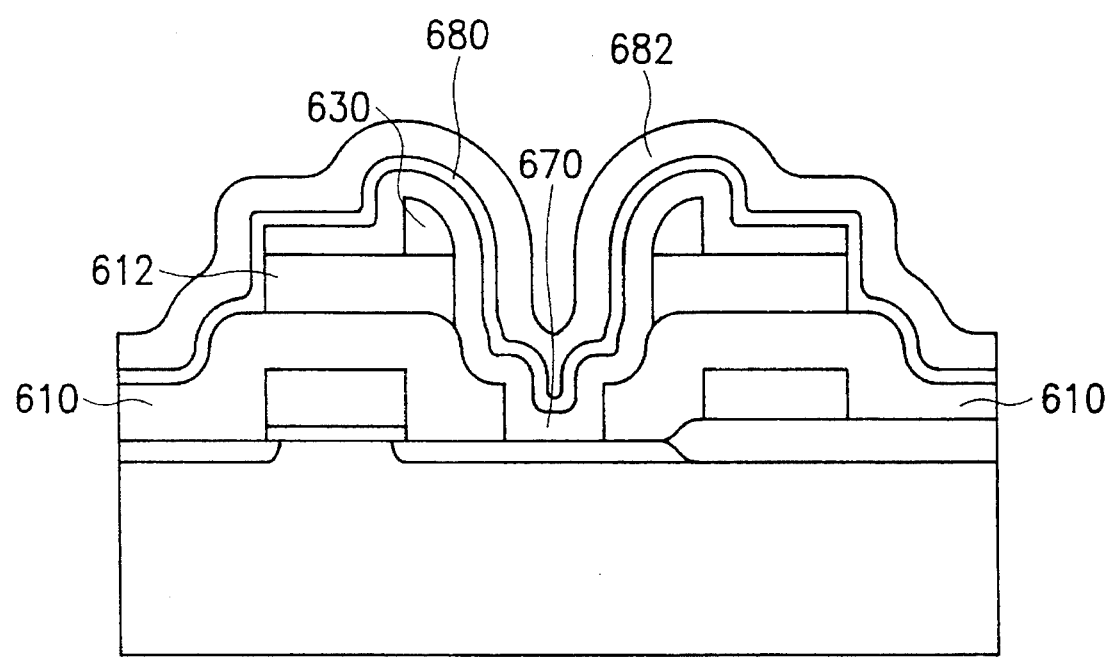

Finally, please refer to FIG. 3I. The first electrode plate 670 and the second insulating layer 612 are patterned by conventional lithography and etching processes, so as to define the desired margin of the capacitor for DRAM cell. A dielectric layer 680, such as a two-layered configuration of nitride/oxide (N/O) or a three-layered configuration of oxide/nitride/oxide (O/N/O) or a layer of tantalum pentoxide ($Ta_2O_5$), is formed on the first electrode plate 670 preferably by CVD). Accordingly, a second electrode plate 682, such as a polysilicon layer doped with impurities, is formed on the dielectric layer 680 preferably by CVD. Hence, the fabrication of a capacitor in accordance with the present invention is completed.

Figure 1:
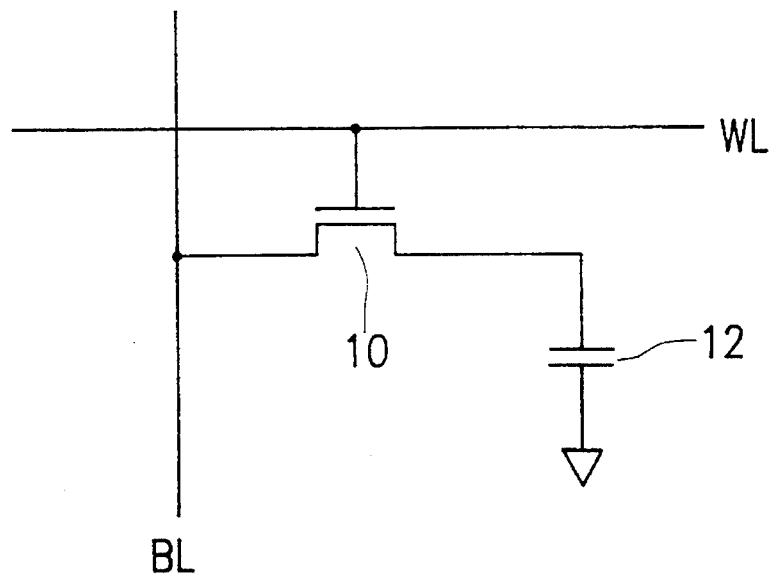
FIG. 1 is a schematic- circuit diagram showing a memory cell of a DRAM device.
Figure 2:
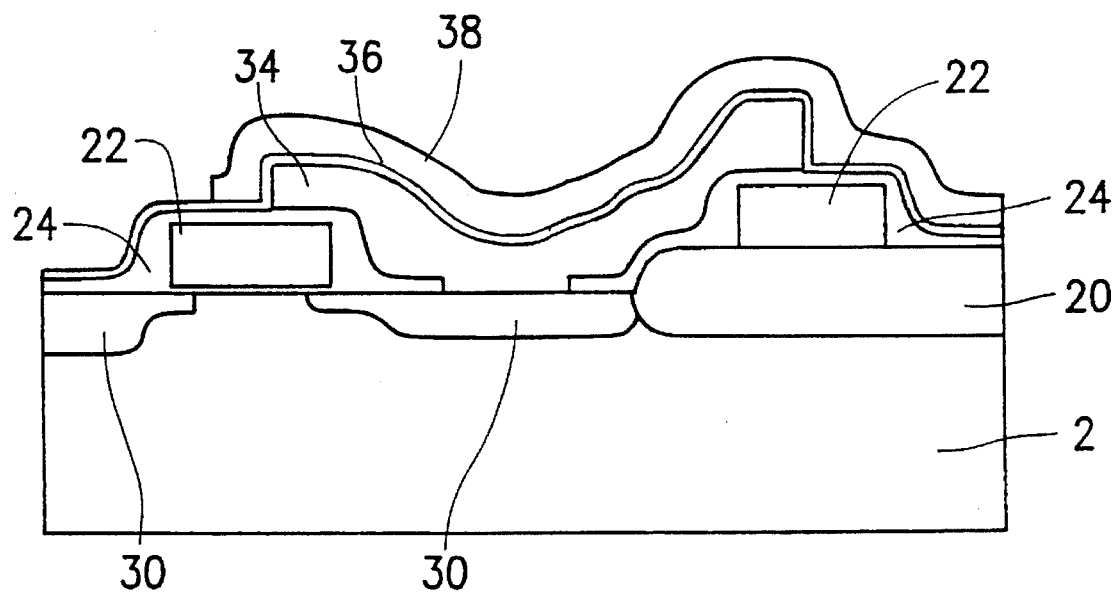
FIG. 2 is a cross-sectional view of a prior art stacked capacitor of a DRAM cell.

As can be seen from the above preferred embodiment, the surface area of the electrode plate of the capacitor in accordance with the present invention is larger than that of the prior art capacitor in FIG. 2. Therefore, the capacitance is improved due to the considerable increase in the surface area of the capacitor electrode plate.

Persons skilled in the art will appreciate the fact that certain conditions, parameters, as well as materials utilized in the description of the present invention may be changed or modified without departing from the scope and spirit of the present invention's disclosure. It therefore should be pointed out that the above description, based on the described embodiments of the present invention, is only intended to describe the invention, not to limit the scope of the invention, which is defined in the claims below.

What is claimed is:

1. A method of fabricating a capacitor for dynamic random access memory cell, comprising the steps of:
   (a) providing a semiconductor substrate having a transistor device formed thereon, said transistor device comprising a gate electrode and source/drain regions;
   (b) sequentially forming a first insulating layer, a second insulating layer, and a barrier layer on said semiconductor substrate;
   (c) etching a portion of said barrier layer to form a first contact opening over one of said source/drain regions;
   (d) forming a first sidewall spacer on a sidewall of said first contact opening of said barrier layer;
   (e) forming a second contact opening by etching said second insulating layer using said barrier layer and said first sidewall spacer as a mask;
   (f) forming a second sidewall spacer on a sidewall of said second contact opening of said second insulating layer;
   (g) removing said barrier layer and forming a third contact opening by etching said first insulating layer using said first sidewall spacer, said second sidewall spacer, and said second insulating layer as a mask;
   (h) removing said second sidewall spacer;
   (i) forming a first electrode plate overlying exposed surfaces of said first sidewall spacer, said second insulating layer, said first insulating layer, and said semiconductor substrate, wherein said first electrode plate is connected to one of said source/drain regions through said third contact opening;
   (j) forming a dielectric layer on said first electrode plate; and
   k) forming a second electrode plate on said dielectric layer to complete the capacitor fabrication.

2. The method of claim 1, prior to the step (j) of forming said dielectric layer further comprising a step of patterning said first electrode plate and said second insulating layer to define a margin of said capacitor.

3. The method of claim 1, wherein said first insulating layer and said barrier layer are made of silicon dioxide, and said second insulating layer is made of silicon nitride.

4. The method of claim 1, wherein said first sidewall spacer is a polysilicon layer.

5. The method of claim 1, wherein said second sidewall spacer is a photoresist layer.

6. The method of claim 1, wherein both said first electrode plate and said second electrode plate are made of polysilicon.

7. The method of claim 1, wherein said dielectric layer is constructed by a two-layered configuration of nitride/oxide.

8. The method of claim 1, wherein said dielectric layer is constructed by a three-layered configuration of oxide/nitride/oxide.

9. The method of claim 1, wherein said dielectric layer is constructed of a layer of tantalum pentoxide.

* * * * *